(12) United States Patent
Kuwahara et al.

(10) Patent No.: US 7,759,978 B2
(45) Date of Patent: Jul. 20, 2010

(54) CURRENT DRIVER CIRCUIT

(75) Inventors: Maho Kuwahara, Tokyo (JP); Kumiko Noguchi, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/501,715

(22) Filed: Jul. 13, 2009

(65) Prior Publication Data

US 2010/0013523 A1    Jan. 21, 2010

(30) Foreign Application Priority Data

Jul. 18, 2008    (JP) .............................. 2008-187316

(51) Int. Cl.
   *H03K 19/094*    (2006.01)
(52) U.S. Cl. .............................. 326/83; 326/82; 327/108
(58) Field of Classification Search .................. 326/82, 326/83, 86, 115; 327/108, 109
   See application file for complete search history.

(56) References Cited

U.S. PATENT DOCUMENTS 7,301,365 B2 * 11/2007 Chan ........................... 326/30

FOREIGN PATENT DOCUMENTS

JP    2003-188661    7/2003

OTHER PUBLICATIONS

AD5821, Technical Data Sheet, Rev. 0, 2007, Analog Devices, Inc., http://www.analog.com/.

* cited by examiner

*Primary Examiner*—Daniel D Chang
(74) *Attorney, Agent, or Firm*—Turocy & Watson, LLP

(57) ABSTRACT

In a case where potential of the first input terminal is lower than that of the second input terminal by an amount of the offset voltage, in a normal operation mode, the control circuit controls the polarity switching circuit so as to input the first contact voltage of the first contact to the first input terminal and input the control voltage to the second input terminal. On the other hand, in a case where the potential of the first input terminal is higher than that of the second input terminal by an amount of the offset voltage, in the normal operation mode, the control circuit controls the polarity switching circuit so as to input the first contact voltage at the first contact to the second input terminal, input the control voltage to the first input terminal, and invert the polarity of the amplified signal.

20 Claims, 2 Drawing Sheets

CURRENT DRIVER CIRCUIT

CROSS-REFERENCE TO RELATED APPLICATION

This application is based upon and claims the benefit of priority from the prior Japanese Patent Application No. 2008-187316, filed on Jul. 18, 2008, the entire contents of which are incorporated herein by reference.

BACKGROUND OF THE INVENTION

1. Field of the Invention

The present invention relates to a current driver circuit for controlling output current.

2. Background Art

Hitherto, there is an automatic focus (AF) used in a cellular phone, a digital camera, and the like, to which a Voice Coil Motor (VCM) is applied.

The VCM is provided to move a lens by current driving. When the VCM is applied to a cellular phone or the like, from the viewpoint of battery operation, a wide range of voltages, for example, 2.3 V to 5.5 V is necessary as the source voltage.

The VCM is also requested to perform low-power-consumption and high-precision current value driving. Depending on an operation characteristic of the VCM, for example, the drive current of about 100 mA at the maximum is necessary.

In the case of low-voltage operation using, for example, a source voltage of 2.3 V, the voltage of a current drive terminal in a current driver circuit for controlling current to be supplied to the VCM is about 0.1 V to 0.2 V.

There is a conventional current driver circuit which detects output current and stores current value of output current to be adjusted (voltage value). The current driver circuit has a comparator for detecting that an output of a differential amplifier is zero, and adjusts an offset of the differential amplifier based on the detection result of the comparator (see Japanese Patent No. 4022059, for example).

As described above, the voltage of a current output terminal has to be low. Consequently, a sense resistor for detecting output current has considerably low resistance of, for example, about 0.5 Ω.

For this reason, for example, a detection value of the sense resistor is small, so that an offset held by an operational amplifier itself is unignorable. Further, in the case where an offset of the operational amplifier is large, an error in output current occurs, and there is a problem that it is difficult to set small output current.

As another conventional art, there is a method of detecting an offset voltage of a differential input of an operational amplifier directly by a comparator and, based on the detection result, adding offset correction current to the differential input of the operational amplifier to perform correction. In this case, as the operational amplifier, for example, a folded cascode operational amplifier is used. The offset correction current is passed to a folded differential pair of transistors from the outside.

However, in the conventional art, to directly detect the offset voltage of the operational amplifier, a high-precision comparator capable of detecting the difference of considerably small voltages is needed.

In the folded cascode operational amplifier, the offset adjustment is performed with a current value. Consequently, a current-type Digital to Analog Converter (DAC) has to be internally provided. In addition, to make the operational amplifier operate with high precision in a wide voltage range of 2.2 V to 5.5 V, the current source or the like of the operational amplifier has to have a cascode configuration.

As a result, the structure of the operational amplifier is complicated, the circuit scale is increased, and it causes a problem that power consumption increases.

Further, in the method of directly detecting the offset voltage of the operational amplifier, the correction cannot be made in the case where an output value of the DAC for offset adjustment changes due to power source/temperature fluctuations. Due to this, there is a problem that the influence of the fluctuation appears as an offset of the output current.

SUMMARY OF THE INVENTION

According to one aspect of the present invention, there is provided: A current driver circuit comprising:

a current output terminal from which current is output;

a first transistor having one end connected to the current output terminal;

a first sense resistor connected between the other end of the first transistor and the ground;

an operational amplifier having an output connected to a first control electrode of the first transistor, having first and second input terminals, and outputting a signal to the first control electrode based on a voltage input to the first input terminal and a voltage input to the second input terminal;

a polarity switching circuit having a first switching terminal to which a first contact voltage at a first contact between the first sense resistor and the first transistor is input and a second switching terminal to which a control voltage for controlling a current output from the current output terminal is input, capable of outputting the first contact voltage and the control voltage to the first and second input terminals, and capable of inverting the polarity of an amplified signal output from the operational amplifier; and a control circuit that outputs the control voltage obtained by adding an offset voltage of the operational amplifier between the first and second input terminals to a set voltage which is set in correspondence with value of a target output current, wherein in a case where potential of the first input terminal is lower than that of the second input terminal by an amount of the offset voltage, in a normal operation mode in which normal operation is performed, the control circuit controls the polarity switching circuit so as to input the first contact voltage of the first contact to the first input terminal and input the control voltage to the second input terminal and, on the other hand, in a case where the potential of the first input terminal is higher than that of the second input terminal by an amount of the offset voltage, in the normal operation mode, the control circuit controls the polarity switching circuit so as to input the first contact voltage at the first contact to the second input terminal, input the control voltage to the first input terminal, and invert the polarity of the amplified signal.

According to another aspect of the present invention, there is provided: A current driver circuit comprising:

a current output terminal from which current is output;

a first transistor that is a MOS transistor having one end connected to the current output terminal;

a first sense resistor connected between the other end of the first transistor and the ground;

an operational amplifier having an output connected to a first control electrode of the first transistor, having first and second input terminals, and outputting a signal to the first control electrode based on a voltage input to the first input terminal and a voltage input to the second input terminal;

a polarity switching circuit having a first switching terminal to which a first contact voltage at a first contact between the first sense resistor and the first transistor is input and a second switching terminal to which a control voltage for controlling a current output from the current output terminal is input, capable of outputting the first contact voltage and the control voltage to the first and second input terminals, and capable of inverting the polarity of an amplified signal output from the operational amplifier; and a control circuit that outputs the control voltage obtained by adding an offset voltage of the operational amplifier between the first and second input terminals to a set voltage which is set in correspondence with value of a target output current, wherein in a case where potential of the first input terminal is lower than that of the second input terminal by an amount of the offset voltage, in a normal operation mode in which normal operation is performed, the control circuit controls the polarity switching circuit so as to input the first contact voltage of the first contact to the first input terminal and input the control voltage to the second input terminal and, on the other hand, in a case where the potential of the first input terminal is higher than that of the second input terminal by an amount of the offset voltage, in the normal operation mode, the control circuit controls the polarity switching circuit so as to input the first contact voltage at the first contact to the second input terminal, input the control voltage to the first input terminal, and invert the polarity of the amplified signal.

According to still another aspect of the present invention, there is provided: A current driver circuit comprising:

a current output terminal from which current is output;

a first transistor that is an nMOS transistor having one end connected to the current output terminal;

a first sense resistor connected between the other end of the first transistor and the ground;

an operational amplifier having an output connected to a first control electrode of the first transistor, having a first input terminal being a inverting input terminal and a second input terminal being a non-inverting input terminal, and outputting a signal to the first control electrode based on a voltage input to the first input terminal and a voltage input to the second input terminal;

a polarity switching circuit having a first switching terminal to which a first contact voltage at a first contact between the first sense resistor and the first transistor is input and a second switching terminal to which a control voltage for controlling a current output from the current output terminal is input, capable of outputting the first contact voltage and the control voltage to the first and second input terminals, and capable of inverting the polarity of an amplified signal output from the operational amplifier; and a control circuit that outputs the control voltage obtained by adding an offset voltage of the operational amplifier between the first and second input terminals to a set voltage which is set in correspondence with value of a target output current, wherein in a case where potential of the first input terminal is lower than that of the second input terminal by an amount of the offset voltage, in a normal operation mode in which normal operation is performed, the control circuit controls the polarity switching circuit so as to input the first contact voltage of the first contact to the first input terminal and input the control voltage to the second input terminal and, on the other hand, in a case where the potential of the first input terminal is higher than that of the second input terminal by an amount of the offset voltage, in the normal operation mode, the control circuit controls the polarity switching circuit so as to input the first contact voltage at the first contact to the second input terminal, input the control voltage to the first input terminal, and invert the polarity of the amplified signal.

DETAILED DESCRIPTION

Embodiments of the present invention will be described below with reference to the drawings.

First Embodiment

Figure 1:
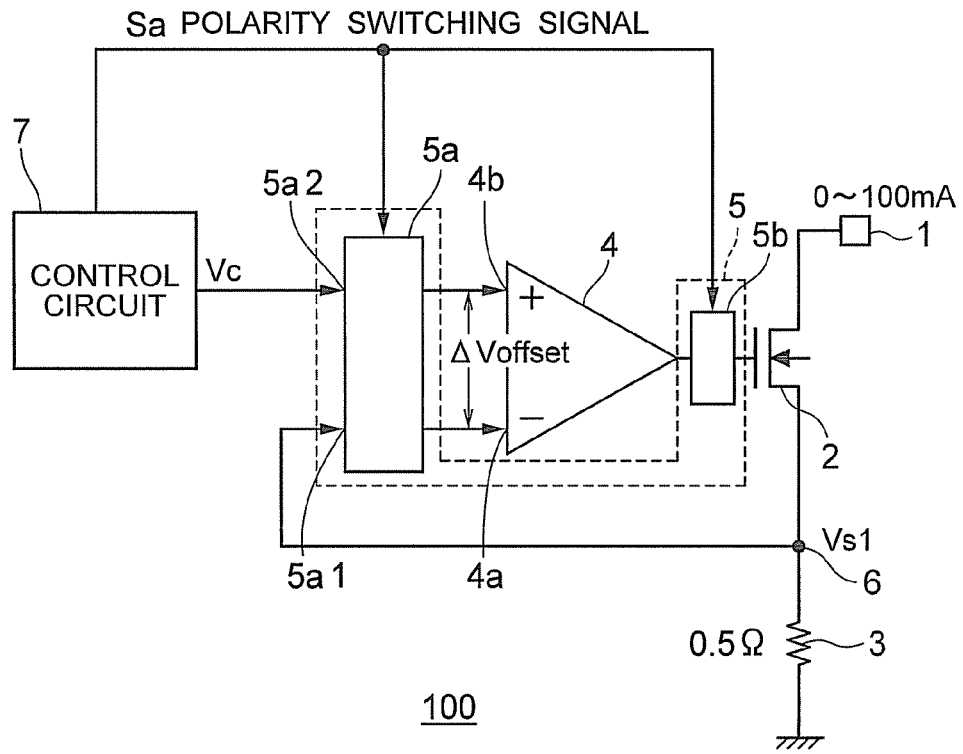
FIG. 1 is a circuit diagram showing an example of the configuration of a current driver circuit 100 related to a first embodiment as an aspect of the present invention.
Figure 2:
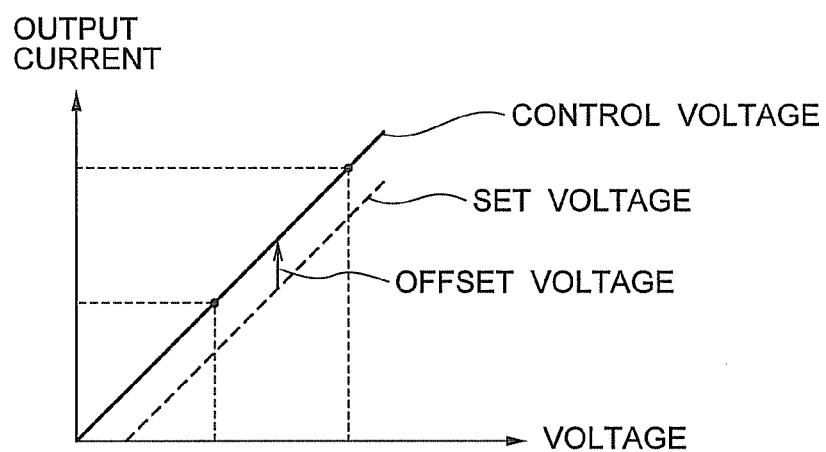
FIG. 2 is a diagram showing the relation between output current of the current driver circuit 100, set voltage, and control voltage.

FIG. 1 is a circuit diagram showing an example of the configuration of a current driver circuit 100 related to a first embodiment as an aspect of the present invention. FIG. 2 is a diagram showing the relation between output current of the current driver circuit 100, set voltage, and control voltage.

As shown in FIG. 1, the current driver circuit 100 has a current output terminal 1, a first transistor 2, a first sense resistor 3, an operation amplifier 4, a polarity switching circuit 5, and a control circuit 7.

The current output terminal 1 outputs, for example, output current of 100 mA or less. To the current output terminal 1, as described above, for example, a VCM is connected as a load. Current is supplied to the VCM. The current driver circuit 100 can operate in the range of the voltage of the current output terminal 1 of, for example, 0.2 V or less (desirably, 0.1 V to 0.2 V).

The first transistor 2 is an nMOS transistor for driving whose one end (drain) is connected to the current output terminal 1. The first transistor 2 may be a pMOS transistor or a bipolar transistor as necessary.

The first sense resistor 3 is connected between the other end (source) of the first transistor 2 and the ground. The resistance value of the first sense resistor 3 is 1Ω or less (for example, about 0.5Ω).

The output of the operational amplifier 4 is connected to the gate electrode (control electrode) of the first transistor 2 via the polarity switching circuit 5. The operational amplifier 4 has an inverting input terminal 4a as a first input terminal and a non-inverting input terminal 4b as a second input terminal. The operational amplifier 4 outputs an amplified signal to the gate electrode of the first transistor 2 via the polarity switching circuit 5 based on the voltage input to the inverting input terminal 4a and the voltage input to the non-inverting input terminal 4b.

The polarity switching circuit 5 includes an input polarity switching unit 5a and an output polarity switching unit 5b.

The input polarity switching unit 5a has a first switching terminal 5a1 to which the voltage at a first contact 6 between the first sense resistor 3 and the first transistor 2 is input, and a second switching terminal 5a2 to which a control voltage Vc output from the control circuit 7 is input.

The input polarity switching unit 5a can switch between the voltage input to the first switching terminal 5a1 and the voltage input to the second switching terminal 5a2 in accordance with a polarity switching signal Sa output from the control circuit 7 and output the switched voltages to the inverting input terminal 4a and the non-inverting input terminal 4b.

The output polarity switching unit 5b can invert the polarity of an output signal (amplified signal) output from the operational amplifier 4 in accordance with a polarity switching signal Sa and output the inverted signal to the gate electrode of the first transistor 2.

In the case of inverting the polarity of the operational amplifier 4 as described above, the polarity switching circuit 5 also switches connection of an internal circuit (not shown) of the operational amplifier 4 so that the operational amplifier 4 can perform desired differential operation as necessary.

The control circuit 7 outputs the control voltage Vc obtained by adding an offset voltage ΔVoffset of the operational amplifier 4 between the inverting input terminal 4a and the non-inverting input terminal 4b to the set voltage which is set in correspondence with the value of target output current. As will be described later, according to the control voltage Vc, current output from the current output terminal 1 is controlled. The set voltage is input from an external circuit (not shown) or the like to the control circuit 7.

The control circuit 7 obtains data related to the offset voltage Voffset from the external circuit (not shown) or from a nonvolatile memory (not shown) in the control circuit 7.

The offset voltage Voffset of the operational amplifier 4 of the current driver circuit 100 is obtained by, for example, changing the voltage input to the operational amplifier 4 and measuring current of the current output terminal 1 by a test circuit (not shown). At this time, which one of the potential of the inverting input terminal 4a of the operational amplifier 4 and the potential of the non-inverting input terminal 4b is higher is also determined.

An example of the operation of the current driver circuit 100 having such a configuration will be described. A normal operation mode in which the current driver circuit 100 normally operates will be described.

First, information on the set voltage is input from the external circuit (not shown) to the control circuit 7, and a target value of the output current is set.

Next, the control circuit 7 obtains the control voltage Vc by adding the offset voltage Voffset of the operational amplifier 4 to the set voltage.

In the case where the potential of the inverting input terminal 4a is lower than the potential of the non-inverting input terminal 4b by an amount of the offset voltage Voffset, in the normal operation mode, the control circuit 7 controls the polarity switching circuit 5 so as to input a voltage Vs1 of the first contact 6 to the inverting input terminal 4a and input the control voltage Vc to the non-inverting input terminal 4b.

On the other hand, in the case where the potential of the inverting input terminal 4a is higher than the potential of the non-inverting input terminal 4b by an amount of the offset voltage Voffset, in the normal operation mode, the control circuit 7 controls the polarity switching circuit 5 so as to input the voltage Vs1 of the first contact 6 to the non-inverting input terminal 4b, input the control voltage Vc to the first input terminal, and invert the polarity of the amplified signal.

As described above, the control circuit 7 obtains the control voltage Vs by adding the offset voltage Voffset of the operational amplifier 4 to the set voltage which is set in correspondence with the value of the target output current. That is, the control circuit 7 performs adjustment in the direction of increasing the control voltage Vs (FIG. 2). At this time, by combining polarity switching of the operational amplifier 4, adjustment corresponding to the offset voltage is made possible.

As described above, the current driver circuit 100 does not add the offset current directly to the operational amplifier like in the conventional art. Consequently, the structure of the operational amplifier can be made simple. That is, power consumption and area of the current driver circuit 100 can be reduced.

By adjusting the offset voltage in such a manner, the operational amplifier 4 controls the first transistor 2 so that the set voltage (that is, voltage obtained by subtracting the offset voltage from the control voltage) and the voltage Vs1 of the first contact 6 become equal to each other. As a result, the target output current corresponding to the set voltage is output from the current output terminal 1. That is, the current driver circuit 100 can reduce the offset current of the output current.

The current driver circuit of the embodiment can control output current more precisely as described above.

Second Embodiment

In a second embodiment, particularly, a configuration of adjusting the offset voltage of the operational amplifier in the current driver circuit will be described.

Figure 3:
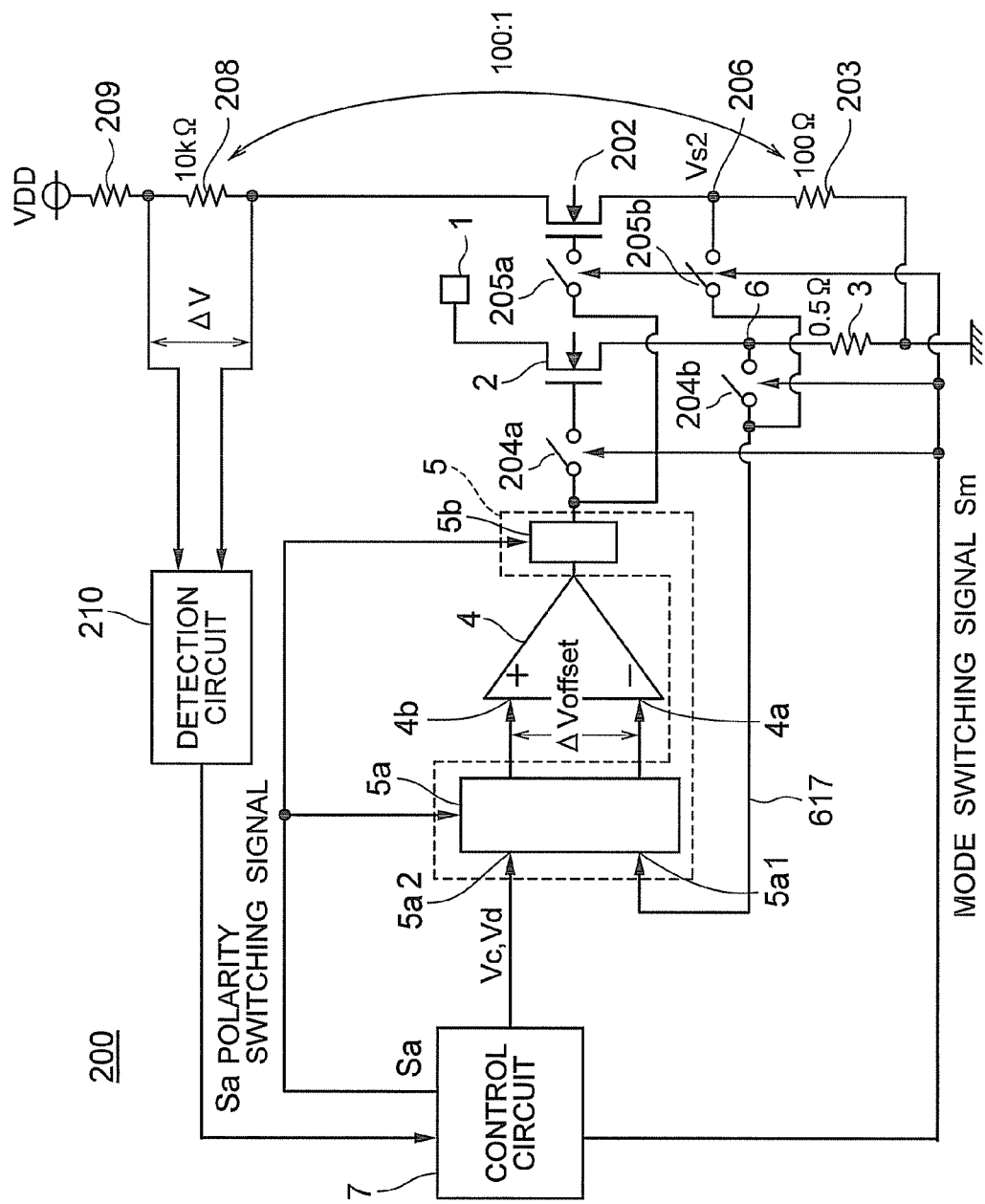
FIG. 3 is a circuit diagram showing an example of the configuration of a current driver circuit 200 related to the second embodiment as an aspect of the present invention.

FIG. 3 is a circuit diagram showing an example of the configuration of a current driver circuit 200 related to the second embodiment as an aspect of the present invention.

As shown in FIG. 3, the current driver circuit 200 includes, in addition to the components of the current driver circuit 100 of the first embodiment, a second transistor 202, a second sense resistor 203, a first switching element 204a, a second switching element 204b, a third switching element 205a, a fourth switching element 205b, a conversion resistor 208, and a detection circuit 210.

The first switching element 204a is connected between the output of the operational amplifier 4 and the gate electrode of the first transistor 2. The first switching element 204a is on/off-controlled in accordance with a mode switching signal Sm output from the control circuit 7.

The second switching element 204b is connected between the first switching terminal 5a1 and the first contact 6. The second switching element 204b is on/off-controlled in accordance with the mode switching signal Sm output from the control circuit 7.

The second transistor 202 is an nMOS transistor connected between a power source VDD and the ground. The second transistor 202 may be a pMOS transistor or a bipolar transistor as necessary.

The second sense resistor 203 is connected between the source of the second transistor 202 and the ground.

A temperature characteristic of the second sensor resistor 203 is set to be equal to that of the first sense resistor 3.

The resistance value of the second sense resistor 203 is, for example, 100Ω. That is, the resistance value of the second sense resistor 203 is set to be larger than that of the first sense resistor 3.

The third switching element 205a is connected between the output of the operational amplifier 4 and the gate electrode of the second transistor 202. The third switching element 205a is on/off-controlled in accordance with the mode switching signal Sm output from the control circuit 7.

The fourth switching element 205b is connected between a second contact 206 between the second sense resistor 203 and the second transistor 202 and the first switching terminal 5a1.

The fourth switching element 205b is on/off-controlled in accordance with the mode switching signal Sm output from the control circuit 7.

The conversion resistor 208 is connected between the power source VDD and the drain of the second transistor 202.

The resistance value of the conversion resistor 208 is set to, for example, about 10 kΩ. That is, the resistance value of the conversion resistor 208 is set to be larger than that of the second sense resistor 203.

A resistor 209 is connected between the power source VDD and the conversion resistor 208.

The detection circuit 210 detects a potential difference in the conversion resistor 208 and outputs the detection result to the control circuit 7. The control circuit 7 obtains the potential difference in the conversion resistor 208 based on the detection result.

The second sense resistor 203, the second transistor 202, the conversion resistor 208, and the detection circuit 210 are a system for detecting the offset voltage Voffset.

An example of the operation of the current driver circuit 200 having such a configuration will be described.

First, an offset detection mode in which the current driver circuit 200 detects the offset voltage Voffset of the operational amplifier 4 will be described.

In the offset detection mode, by the mode switching signal Sm, the control circuit 7 turns off the first switching element 204a and the second switching element 204b, and turns on the third switching element 205a and the fourth switching element 205b. By the operation, the control circuit 7 inputs the amplified signal to the gate electrode of the second transistor 202, and inputs a voltage Vs2 of the second contact 206 to the first switching terminal 5a1.

Next, the control circuit 7 outputs a voltage Vd for detection having a magnitude that makes current flow at least in the second sense resistor 203 and the conversion resistor 208 to the second switching terminal. That is, the control circuit 7 can detect the potential difference in the conversion resistor 208 in a state where the current driver circuit 200 performs a desired feedback operation. The magnitude of the voltage Vd for detection is set to be larger than, for example, an expected offset voltage Voffset.

The control circuit 7 controls the polarity switching circuit 5 to input the voltage Vs2 of the second contact 206 to the first input terminal 4a and to input the voltage Vd for detection to the second input terminal 4b by the polarity switching signal Sa. In this state, the control circuit 7 obtains a first potential difference ΔV1 in the conversion resistor 208 by using the detection circuit 210.

The control circuit 7 calculates a first sense voltage Vsense1 at the second contact 206 corresponding to the first potential difference ΔV1 based on a resistance ratio between the second sense resistor 203 and the conversion resistor 208.

Next, the control circuit 7 controls the polarity switching circuit 5 to input the voltage Vs2 of the second contact 206 to the second input terminal 4b and to input the voltage Vd for detection to the first input terminal 4a by the polarity switching signal Sa to invert the polarity of the amplified signal. In this state, the control circuit 7 obtains a second potential difference ΔV2 in the conversion resistor 208 by using the detection circuit 210.

Based on the resistance ratio, the control circuit 7 calculates a second sense voltage Vsense2 at the second contact 206 corresponding to the second potential difference ΔV2.

The control circuit 7 calculates the absolute value of the half of the potential difference between the first sense voltage Vsense1 and the second sense voltage Vsense2 as the offset voltage Voffset.

By the above operation, the control circuit 7 obtains the offset voltage Voffset.

A normal operation mode in which the current driver circuit 200 performs normal operation while reducing the influence of the obtained offset voltage will be described.

First, information related to set voltage is input from an external circuit (not shown) to the control circuit 7, and a target value of output current is set.

Next, the control circuit 7 obtains the control voltage Vc by adding the offset voltage Voffset of the operational amplifier 4 to the set voltage.

In the normal operation mode, the control circuit 7 turns on the first switching element 204a and the second switching element 204b, and turns off the third switching element 205a and the fourth switching element 205b. In such a manner, the control circuit 7 controls so that the amplified signal is input to the gate electrode of the first transistor 2 and the voltage Vs1 at the first contact 6 is input to the first switching terminal 5a1.

In the case where the first potential difference ΔV1 is larger than the second potential difference ΔV2, in the normal operation mode, the control circuit 7 controls the polarity switching circuit 5 so as to input the voltage Vs1 of the first contact 6 to the first input terminal 4a and input the control voltage Vc to the second input terminal 4b by the polarity switching signal Sa.

On the other hand, in the case where the first potential difference ΔV1 is smaller than the second potential difference ΔV2, in the normal operation mode, the control circuit 7 controls the polarity switching circuit 5 so as to input the voltage Vs1 of the first contact 6 to the second input terminal 4b, and input the control voltage Vc to the first input terminal 4a by the polarity switching signal Sa. Further, the control circuit 7 controls the polarity switching circuit 5 so as to invert the polarity of the amplified signal by the polarity switching signal Sa.

As described above, a temperature characteristic of the second sense resistor 203 is equal to that of the first sense resistor 3.

With the configuration, the influence of the temperature fluctuation on detection of the offset voltage Voffset can be reduced. Therefore, precision of detection of the offset voltage Voffset improves, and current output on which the influence of fluctuations in temperature is small can be obtained.

As described above, the resistance value of the second sense resistor 203 is larger than that of the first sense resistor 3.

Thus, in the offset detection mode, a desired voltage drop can be caused in the second sense resistor 203 with small current consumption.

As described above, the resistance value of the conversion resistor 208 is larger than that of the second sense resistor 203. That is, in the second embodiment, the resistance ratio between the second sense resistor 203 and the conversion resistor 208 is 100Ω:10 kΩ, so that the potential difference ΔV in the conversion resistor 208 is 100 times as large as the potential difference in the second sense resistor 203.

As compared with the case of directly detecting the potential difference in the second sense resistor 203, the precision requested for the detection circuit 210 to detect the potential difference in the conversion resistor 208 can be set lower. That is, the configuration of the detection circuit 210 can be made simpler.

By adjusting the offset voltage Voffset as described above, the operational amplifier 4 controls the first transistor 2 so that the set voltage (that is, the voltage obtained by subtracting the offset voltage from the control voltage) and the voltage Vs1 at the first contact 6 become equal to each other.

As a result, the target output current corresponding to the set voltage is output from the current output terminal 1.

That is, the current driver circuit 200 can reduce the offset current of the output current.

The current driver circuit of the second embodiment can control output current more precisely as described above.

What is claimed is:

1. A current driver circuit comprising:
   a current output terminal from which current is output;
   a first transistor having one end connected to the current output terminal;
   a first sense resistor connected between the other end of the first transistor and the ground;
   an operational amplifier having an output connected to a first control electrode of the first transistor, having first and second input terminals, and outputting a signal to the first control electrode based on a voltage input to the first input terminal and a voltage input to the second input terminal;
   a polarity switching circuit having a first switching terminal to which a first contact voltage at a first contact between the first sense resistor and the first transistor is input and a second switching terminal to which a control voltage for controlling a current output from the current output terminal is input, capable of outputting the first contact voltage and the control voltage to the first and second input terminals, and capable of inverting the polarity of an amplified signal output from the operational amplifier; and
   a control circuit that outputs the control voltage obtained by adding an offset voltage of the operational amplifier between the first and second input terminals to a set voltage which is set in correspondence with value of a target output current,
   wherein in a case where potential of the first input terminal is lower than that of the second input terminal by an amount of the offset voltage, in a normal operation mode in which normal operation is performed, the control circuit controls the polarity switching circuit so as to input the first contact voltage of the first contact to the first input terminal and input the control voltage to the second input terminal and,
   on the other hand, in a case where the potential of the first input terminal is higher than that of the second input terminal by an amount of the offset voltage, in the normal operation mode, the control circuit controls the polarity switching circuit so as to input the first contact voltage at the first contact to the second input terminal, input the control voltage to the first input terminal, and invert the polarity of the amplified signal.

2. The current driver circuit according to claim 1 further comprising:
   a first switching element connected between the output of the operational amplifier and the first control electrode and on/off-controlled by the control circuit;
   a second switching element connected between the first switching terminal and the first contact and on/off-controlled by the control circuit;
   a second transistor connected between a power source and the ground;
   a second sense resistor connected between the second transistor and the ground;
   a conversion resistor connected between the power source and the second transistor and on/off-controlled by the control circuit;
   a third switching element connected between the output of the operational amplifier and a second control electrode of the second transistor and on/off-controlled by the control circuit; and
   a fourth switching element connected between a second contact and the first switching terminal and on/off-controlled by the control circuit, the second contact being between the second sense resistor and the second transistor,
   wherein the control circuit,
   in an offset detection mode of detecting an offset voltage,
   turns off the first and second switching elements and turns on the third and fourth switching elements so that the amplified signal is input to the second control electrode and a voltage at the second contact is input to the first switching terminal,
   outputs a voltage for detection comprising a magnitude at which current flows in the second sense resistor and the conversion resistor to the second switching terminal,
   controls the polarity switching circuit to input a voltage at the second contact to the first input terminal and to input the voltage for detection to the second input terminal, and in this state, obtains a first potential difference in the conversion resistor,
   controls the polarity switching circuit to input a voltage at the second contact to the second input terminal, to input the voltage for detection to the first input terminal, and to invert the polarity of the amplified signal, and in this state, obtains a second potential difference in the conversion resistor,
   calculates a first sense voltage at the second contact corresponding to the first potential difference based on a resistance ratio between the second sense resistor and the conversion resistor,
   calculates a second sense voltage at the second contact corresponding to the second potential difference based on the resistance ratio,
   calculates an absolute value of the half of a potential difference between the first sense voltage and the second sense voltage as the offset voltage,
   in the normal operation mode,
   turns on the first and second switching elements and turns off the third and fourth switching elements so that the amplified signal is input to the first control electrode and the first contact voltage at the first contact is input to the first switching terminal,
   in a case where the first potential difference is larger than the second potential difference, controls the polarity switching circuit so as to input the first contact voltage at the first contact to the first input terminal and input the control voltage to the second input terminal and,
   on the other hand, in a case where the first potential difference is smaller than the second potential difference, controls the polarity switching circuit so as to input the first contact voltage at the first contact to the second input terminal, input the control voltage to the first input terminal, and invert the polarity of the amplified signal.

3. The current driver circuit according to claim 2, further comprising a detection circuit that detects a potential difference in the conversion resistor and outputting a result of the detection to the control circuit,
   wherein the control circuit obtains the first potential difference and the second potential difference in the conversion resistor based on the detection result.

4. The current driver circuit according to claim 2, wherein a temperature characteristic of the second sense resistor is set to be equal to that of the first sense resistor.

5. The current driver circuit according to claim 2, wherein the first sense resistor is 1Ω or less, or a voltage of the current output terminal is 0.2 V or less.

6. The current driver circuit according to claim 2, wherein a resistance value of the second sense resistor is larger than that of the first sense resistor.

7. The current driver circuit according to claim 2, wherein a resistance value of the conversion resistor is larger than that of the second sense resistor.

8. A current driver circuit comprising:
a current output terminal from which current is output;
a first transistor that is a MOS transistor having one end connected to the current output terminal;
a first sense resistor connected between the other end of the first transistor and the ground;
an operational amplifier having an output connected to a first control electrode of the first transistor, having first and second input terminals, and outputting a signal to the first control electrode based on a voltage input to the first input terminal and a voltage input to the second input terminal;
a polarity switching circuit having a first switching terminal to which a first contact voltage at a first contact between the first sense resistor and the first transistor is input and a second switching terminal to which a control voltage for controlling a current output from the current output terminal is input, capable of outputting the first contact voltage and the control voltage to the first and second input terminals, and capable of inverting the polarity of an amplified signal output from the operational amplifier; and
a control circuit that outputs the control voltage obtained by adding an offset voltage of the operational amplifier between the first and second input terminals to a set voltage which is set in correspondence with value of a target output current,
wherein in a case where potential of the first input terminal is lower than that of the second input terminal by an amount of the offset voltage, in a normal operation mode in which normal operation is performed, the control circuit controls the polarity switching circuit so as to input the first contact voltage of the first contact to the first input terminal and input the control voltage to the second input terminal and,
on the other hand, in a case where the potential of the first input terminal is higher than that of the second input terminal by an amount of the offset voltage, in the normal operation mode, the control circuit controls the polarity switching circuit so as to input the first contact voltage at the first contact to the second input terminal, input the control voltage to the first input terminal, and invert the polarity of the amplified signal.

9. The current driver circuit according to claim 8 further comprising:
a first switching element connected between the output of the operational amplifier and the first control electrode and on/off-controlled by the control circuit;
a second switching element connected between the first switching terminal and the first contact and on/off-controlled by the control circuit;
a second transistor that is a MOS transistor connected between a power source and the ground;
a second sense resistor connected between the second transistor and the ground;
a conversion resistor connected between the power source and the second transistor and on/off-controlled by the control circuit;
a third switching element connected between the output of the operational amplifier and a second control electrode of the second transistor and on/off-controlled by the control circuit; and
a fourth switching element connected between a second contact and the first switching terminal and on/off-controlled by the control circuit, the second contact being between the second sense resistor and the second transistor,
wherein the control circuit,
in an offset detection mode of detecting an offset voltage,
turns off the first and second switching elements and turns on the third and fourth switching elements so that the amplified signal is input to the second control electrode and a voltage at the second contact is input to the first switching terminal,
outputs a voltage for detection comprising a magnitude at which current flows in the second sense resistor and the conversion resistor to the second switching terminal,
controls the polarity switching circuit to input a voltage at the second contact to the first input terminal and to input the voltage for detection to the second input terminal, and in this state, obtains a first potential difference in the conversion resistor,
controls the polarity switching circuit to input a voltage at the second contact to the second input terminal, to input the voltage for detection to the first input terminal, and to invert the polarity of the amplified signal, and in this state, obtains a second potential difference in the conversion resistor,
calculates a first sense voltage at the second contact corresponding to the first potential difference based on a resistance ratio between the second sense resistor and the conversion resistor,
calculates a second sense voltage at the second contact corresponding to the second potential difference based on the resistance ratio,
calculates an absolute value of the half of a potential difference between the first sense voltage and the second sense voltage as the offset voltage,
in the normal operation mode,
turns on the first and second switching elements and turns off the third and fourth switching elements so that the amplified signal is input to the first control electrode and the first contact voltage at the first contact is input to the first switching terminal,
in a case where the first potential difference is larger than the second potential difference, controls the polarity switching circuit so as to input the first contact voltage at the first contact to the first input terminal and input the control voltage to the second input terminal and,
on the other hand, in a case where the first potential difference is smaller than the second potential difference, controls the polarity switching circuit so as to input the first contact voltage at the first contact to the second input terminal, input the control voltage to the first input terminal, and invert the polarity of the amplified signal.

10. The current driver circuit according to claim 9, further comprising a detection circuit that detects a potential difference in the conversion resistor and outputting a result of the detection to the control circuit,
wherein the control circuit obtains the first potential difference and the second potential difference in the conversion resistor based on the detection result.

11. The current driver circuit according to claim 9, wherein a temperature characteristic of the second sense resistor is set to be equal to that of the first sense resistor.

12. The current driver circuit according to claim 9, wherein the first sense resistor is 1Ω or less, or a voltage of the current output terminal is 0.2 V or less.

13. The current driver circuit according to claim 9, wherein a resistance value of the second sense resistor is larger than that of the first sense resistor.

14. The current driver circuit according to claim 9, wherein a resistance value of the conversion resistor is larger than that of the second sense resistor.

15. A current driver circuit comprising:
a current output terminal from which current is output;
a first transistor that is an nMOS transistor having one end connected to the current output terminal;
a first sense resistor connected between the other end of the first transistor and the ground;
an operational amplifier having an output connected to a first control electrode of the first transistor, having a first input terminal being a inverting input terminal and a second input terminal being a non-inverting input terminal, and outputting a signal to the first control electrode based on a voltage input to the first input terminal and a voltage input to the second input terminal;
a polarity switching circuit having a first switching terminal to which a first contact voltage at a first contact between the first sense resistor and the first transistor is input and a second switching terminal to which a control voltage for controlling a current output from the current output terminal is input, capable of outputting the first contact voltage and the control voltage to the first and second input terminals, and capable of inverting the polarity of an amplified signal output from the operational amplifier; and
a control circuit that outputs the control voltage obtained by adding an offset voltage of the operational amplifier between the first and second input terminals to a set voltage which is set in correspondence with value of a target output current,
wherein in a case where potential of the first input terminal is lower than that of the second input terminal by an amount of the offset voltage, in a normal operation mode in which normal operation is performed, the control circuit controls the polarity switching circuit so as to input the first contact voltage of the first contact to the first input terminal and input the control voltage to the second input terminal and,
on the other hand, in a case where the potential of the first input terminal is higher than that of the second input terminal by an amount of the offset voltage, in the normal operation mode, the control circuit controls the polarity switching circuit so as to input the first contact voltage at the first contact to the second input terminal, input the control voltage to the first input terminal, and invert the polarity of the amplified signal.

16. The current driver circuit according to claim 15 further comprising:
a first switching element connected between the output of the operational amplifier and the first control electrode and on/off-controlled by the control circuit;
a second switching element connected between the first switching terminal and the first contact and on/off-controlled by the control circuit;
a second transistor that is an nMOS transistor connected between a power source and the ground;
a second sense resistor connected between the second transistor and the ground;
a conversion resistor connected between the power source and the second transistor and on/off-controlled by the control circuit;
a third switching element connected between the output of the operational amplifier and a second control electrode of the second transistor and on/off-controlled by the control circuit; and
a fourth switching element connected between a second contact and the first switching terminal and on/off-controlled by the control circuit, the second contact being between the second sense resistor and the second transistor,
wherein the control circuit,
in an offset detection mode of detecting an offset voltage,
turns off the first and second switching elements and turns on the third and fourth switching elements so that the amplified signal is input to the second control electrode and a voltage at the second contact is input to the first switching terminal,
outputs a voltage for detection comprising a magnitude at which current flows in the second sense resistor and the conversion resistor to the second switching terminal,
controls the polarity switching circuit to input a voltage at the second contact to the first input terminal and to input the voltage for detection to the second input terminal, and in this state, obtains a first potential difference in the conversion resistor,
controls the polarity switching circuit to input a voltage at the second contact to the second input terminal, to input the voltage for detection to the first input terminal, and to invert the polarity of the amplified signal, and in this state, obtains a second potential difference in the conversion resistor,
calculates a first sense voltage at the second contact corresponding to the first potential difference based on a resistance ratio between the second sense resistor and the conversion resistor,
calculates a second sense voltage at the second contact corresponding to the second potential difference based on the resistance ratio,
calculates an absolute value of the half of a potential difference between the first sense voltage and the second sense voltage as the offset voltage,
in the normal operation mode,
turns on the first and second switching elements and turns off the third and fourth switching elements so that the amplified signal is input to the first control electrode and the first contact voltage at the first contact is input to the first switching terminal,
in a case where the first potential difference is larger than the second potential difference, controls the polarity switching circuit so as to input the first contact voltage at the first contact to the first input terminal and input the control voltage to the second input terminal and,
on the other hand, in a case where the first potential difference is smaller than the second potential difference, controls the polarity switching circuit so as to input the first contact voltage at the first contact to the second input terminal, input the control voltage to the first input terminal, and invert the polarity of the amplified signal.

17. The current driver circuit according to claim 16, further comprising a detection circuit that detects a potential difference in the conversion resistor and outputting a result of the detection to the control circuit,
wherein the control circuit obtains the first potential difference and the second potential difference in the conversion resistor based on the detection result.

18. The current driver circuit according to claim 16, wherein a temperature characteristic of the second sense resistor is set to be equal to that of the first sense resistor.

19. The current driver circuit according to claim 16, wherein the first sense resistor is 1Ω or less, or a voltage of the current output terminal is 0.2 V or less.

20. The current driver circuit according to claim 16, wherein a resistance value of the second sense resistor is larger than that of the first sense resistor.

* * * * *